(12) United States Patent
Choi et al.

(10) Patent No.: US 7,265,050 B2
(45) Date of Patent: Sep. 4, 2007

(54) METHODS FOR FABRICATING MEMORY DEVICES USING SACRIFICIAL LAYERS

(75) Inventors: Suk-Hun Choi, Gyeonggi-do (KR); Yoon-Ho Son, Gyeonggi-do (KR); Sung-Lae Cho, Gyeonggi-do (KR); Joon-Sang Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/999,103

(22) Filed: Nov. 29, 2004

(65) Prior Publication Data

US 2005/0127347 A1 Jun. 16, 2005

Related U.S. Application Data

(63) Continuation-in-part of application No. 10/873,388, filed on Jun. 22, 2004.

(30) Foreign Application Priority Data

| Dec. 12, 2003 | (KR) | ................ 2003-90874 |
| Apr. 1, 2004 | (KR) | ................ 2004-22720 |
| Jul. 19, 2004 | (KR) | ............. 10-2004-0056125 |

(51) Int. Cl.
  *H01L 21/00* (2006.01)
(52) U.S. Cl. ............... 438/672; 438/675; 438/201; 257/E21.649; 257/E27.084; 257/71
(58) Field of Classification Search ............ 438/675, 438/672; 257/71, E21.649, E27.084
See application file for complete search history.

(56) References Cited

U.S. PATENT DOCUMENTS 3,877,049 A 4/1975 Buckley (Continued)

FOREIGN PATENT DOCUMENTS

| JP | 63272037 A | 11/1988 |
| JP | 2003-174144 | 6/2003 |

OTHER PUBLICATIONS

Park et al, Study of Over-Polishing at the Edge of a Pattern in Selective CMP, Sixth International Symposium on Chemical Mechanical Polishing, 204th Meeting of the Electrochemical Society, Inc., Oct. 12-16, 2003, 8 pages.

(Continued)

*Primary Examiner*—Michelle Estrada
*Assistant Examiner*—Nicholas J. Tobergte
(74) *Attorney, Agent, or Firm*—Myers Bigel Sibley & Sajovec PA

(57) ABSTRACT

A protection layer is formed on a semiconductor substrate having a cell array region and an alignment key region. A plurality of data storage elements are formed on the protection layer in the cell array region. An insulating layer is formed on the data storage elements, a barrier layer is formed on the insulating layer, and a sacrificial layer is formed on the barrier layer. The sacrificial layer, the barrier layer and the insulating layer are patterned to form contact holes that expose the data storage elements, and conductive plugs are formed in the contact holes. The sacrificial layer is etched to leave portions of the conductive plugs protruding from the barrier layer. The protruding portions of the conductive plugs are removed by polishing.

17 Claims, 15 Drawing Sheets

U.S. PATENT DOCUMENTS

| | | | |
|---|---|---|---|
| 5,244,534 A | 9/1993 | Yu et al. | |
| 5,440,167 A | 8/1995 | Iranmanesh | |
| 5,776,833 A | 7/1998 | Chen et al. | |
| 5,789,758 A * | 8/1998 | Reinberg | 257/3 |
| 6,147,395 A | 11/2000 | Gilgen | |
| 6,274,485 B1 * | 8/2001 | Chen et al. | 438/652 |
| 6,806,528 B2 | 10/2004 | Lee et al. | |
| 6,833,331 B2 * | 12/2004 | Saito et al. | 438/789 |
| 6,884,735 B1 | 4/2005 | Okoroanyanwu et al. | |
| 6,972,262 B2 * | 12/2005 | Lee et al. | 438/706 |
| 7,037,762 B2 | 5/2006 | Joo et al. | |
| 2001/0004066 A1 | 6/2001 | Toshima et al. | |

OTHER PUBLICATIONS

Hwang et al, "Completely CMOS-Compatible Phase-Change Nonvolatile RAM Using NMOS Cell Transistors," Non-Volatile Semiconductor Memory Workshop, Feb. 2003, pp. 91-92.

Hwang et al, "Phase Change Chalcogenide Nonvolatile RAM Completely Based on CMOS Technology," VLSI Symposium, Jun. 2003, 3 pages.

Park et al., "Study of Over-polishing at the Edge of a Pattern in Selective CMP," Abs. 930, 204th Meeting of the Electrochemical Society, Inc., Oct. 12-16, 2003, 1 page.

* cited by examiner

METHODS FOR FABRICATING MEMORY DEVICES USING SACRIFICIAL LAYERS

RELATED APPLICATION

The present application is a continuation-in-part of U.S. patent application Ser. No. 10/873,388, filed Jun. 22, 2004, which claims the priority of Korean Patent Application Nos. 2003-90874 and 2004-22720, filed on Dec. 12, 2003 and Apr. 1, 2004, respectively, in the Korean Intellectual Property Office. Also, the present application claims the priority of Korean Patent Application No. 2004-56125, filed on Jul. 19, 2004 in the Korean Intellectual Property Office. The disclosures of all of the above applications are incorporated herein in their entirety by reference.

BACKGROUND OF THE INVENTION

The present invention relates to integrated circuits and fabrication techniques therefor, and more particularly, to memory devices and methods of fabrication therefor.

Factors, such as an ongoing desire for increased circuit integration and the development of new device configurations (e.g., new memory cell types) that are scaleable to extremely small dimensions, have led to an increasing need for techniques for fabricating very small features in integrated circuit devices. Lower bounds on feature size often arise from constraints of photolithography, i.e., the resolution to which layers can be patterned and properly aligned may constrain the size of features that can be fabricated. Techniques, such as the use of sidewall spacers to reduce patterned dimensions of objects like holes in material layers and the use of creative etching techniques, have been developed to lessen some of these constraints, but other barriers to reliably and repeatably forming small structures still remain.

Damascene processes are commonly used in integrated circuit processing to form features such as contacts and wiring patterns. For example, in a typical conventional damascene process, a silicon dioxide layer is formed on a microelectronic substrate. A groove (for wiring) and/or an opening to an underlying region (for a contact) is formed in the dielectric layer. A conductive layer (e.g., a metal containing layer) is then deposited on the dielectric layer, filling the groove and/or opening. Chemical mechanical polishing (CMP) may then be used to remove portions of the conductive layer disposed on the dielectric layer, thus leaving a wiring pattern in the groove and/or a contact plug in the opening.

Such techniques may be used, for example, in fabricating a lower electrode contact (or "small contact") that provides a high current density path for heating a phase-changeable material (e.g., chalcogenide) region in a phase-change memory device. In a typical fabrication process for such a cell, a dielectric layer is formed over a conductive plug or pad that is electrically coupled to a source/drain region of an access transistor formed on a semiconductor substrate, and a small contact hole is made in the dielectric layer to expose an upper surface of the plug or pad. A metal-containing material is then deposited on the dielectric layer and in the small contact hole. Excess material disposed on the dielectric layer is then removed using CMP to leave a small contact plug in the contact hole. A phase-changeable material region is then formed on the surface of the dielectric layer and the small contact plug, and an upper electrode is formed on the phase-changeable material region. Examples of techniques for forming contacts for phase-change memory devices are described in U.S. Pat. Nos. 6,117,720 and 6,147,395.

Conventional processes may have characteristics that can limit the ability to reliably and repeatably make small contacts or other small structures. In particular, in many applications, it may be desirable to remove a metal or other conductive layer as close as possible to the top of a surrounding dielectric layer or region. For example, in forming small contact plugs for phase-change memory cells along the lines described above, it is generally desirable to remove the metal layer down to a shoulder of the opening in the dielectric layer so that the surface area of the individual contact plugs is made as small as possible while maintaining the planarity of the substrate surface and uniformity among the contact plugs. However, using a conventional process as described above can result in less than desirable results due to flaring at the mouths of the contact holes and/or dishing, overerosion, edge over-erosion, and other surface non-uniformity arising from the CMP. Such effects may be exacerbated by variation in pattern density across the surface of the wafer.

SUMMARY OF THE INVENTION

According to some embodiments of the present invention, integrated circuit memory devices are fabricated. A protection layer is formed on a semiconductor substrate having a cell array region and an alignment key region. A plurality of data storage elements are formed on the protection layer in the cell array region. An insulating layer is formed on the data storage elements, a barrier layer is formed on the insulating layer, and a sacrificial layer is formed on the barrier layer. The sacrificial layer, the barrier layer and the insulating layer are patterned to form contact holes that expose the data storage elements, and conductive plugs are formed in the contact holes. The sacrificial layer is etched to leave portions of the conductive plugs protruding from the barrier layer. The protruding portions of the conductive plugs are removed by polishing, e.g., chemical mechanical polishing (CMP).

In some embodiments of the present invention, the data storage elements are formed by forming a plurality of phase change material regions on the protection layer and forming respective upper electrodes on respective ones of the phase change material regions. The sacrificial layer, the barrier layer and the insulating layer may be patterned to form contact holes that expose the upper electrodes. A plurality of lower electrodes may be formed in the protection layer prior to formation of the phase change material regions.

The barrier layer may comprise an impurity blocking layer and/or a stress buffer layer. The barrier layer may comprise a silicon nitride layer and/or a silicon oxynitride layer, and the sacrificial layer may comprise a silicon oxide layer. The barrier layer may comprise a silicon nitride layer, an aluminum oxide layer and/or a titanium oxide layer. The barrier layer may provide a stress opposite to a stress provided by the insulating layer and the sacrificial layer. For example, the barrier layer may provide a compressive stress and the insulating layer and the sacrificial layer may provide a tensile stress.

According to further aspects of the present invention, forming conductive plugs in the contact holes may comprise forming a conductive layer on the sacrificial layer and filling the contact holes and etching the conductive layer to form the conductive plugs. The conductive layer may be etched using dry and/or wet etching.

In further embodiments of the present invention, patterning of the sacrificial layer, the barrier layer and the insulating layer to form contact holes that expose the data storage elements comprises patterning the sacrificial layer, the barrier layer and the insulating layer to form the contact holes in the cell array region and a trench in the alignment key region. An alignment key is formed in the alignment key trench. The alignment key trench may be deeper than the contact holes.

Forming conductive plugs in the contact holes and forming an alignment key may comprise forming a conductive layer on the sacrificial layer, filling the contact holes and conforming to the alignment key trench, and etching the conductive layer to form the conductive plugs and a conductive region disposed in the alignment key trench and on the sacrificial layer adjacent to the alignment key trench. Polishing to remove the protruding portions of the conductive plugs may comprise polishing to remove the protruding portions of the conductive plugs and to remove a portion of the conductive region on the sacrificial layer adjacent the alignment key trench and thereby form the alignment key in the alignment key trench. A conductive plate layer may be formed on the contact plugs and patterning using the alignment key to form plate lines on the contact plugs.

In further embodiments of the present invention, a memory device comprises a substrate having a cell array region, a peripheral circuit region and an alignment key region. A protection layer is disposed on the substrate, and a plurality of data storage elements are disposed on the protection layer in the cell array region. An insulating layer is disposed on the data storage elements and a barrier layer is disposed on the insulating layer. Contact plugs pass through the barrier layer and the insulating layer to contact data storage elements.

DETAILED DESCRIPTION OF EXEMPLARY EMBODIMENTS

Figure 1:
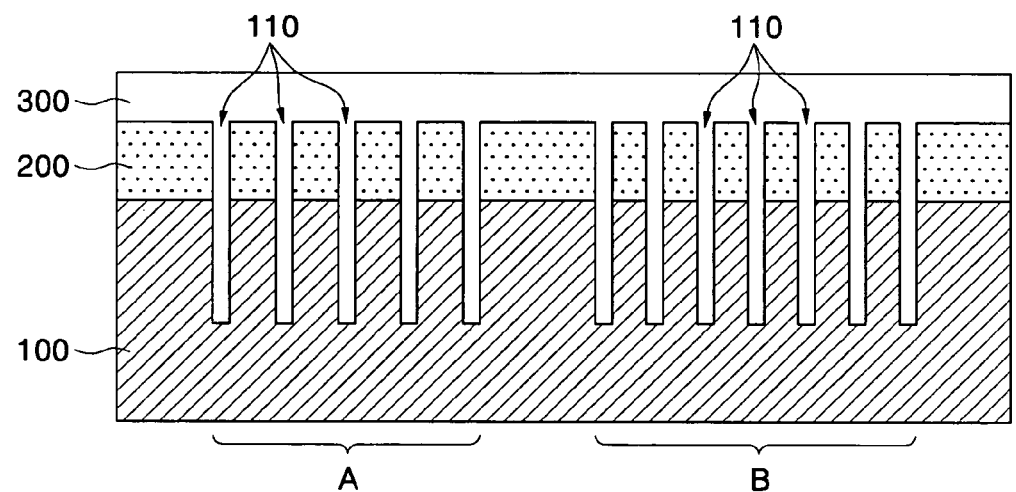
FIGS. 1-4 are cross-sectional views illustrating exemplary operations of a multi-CMP process for forming structures in a dielectric layer according to some embodiments of the present invention.

The present invention now will be described more fully hereinafter with reference to the accompanying drawings, in which typical and exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will be understood that when an element such as a layer, region or substrate is referred to as being "on" another element, it can be directly on the other element or intervening elements may also be present. Furthermore, relative terms, such as "beneath," may be used herein to describe one element's relationship to another elements as illustrated in the drawings. It will be understood that relative terms are intended to encompass different orientations of the device in addition to the orientation depicted in the drawings. For example, if the device in the drawings is turned over, elements described as "below" other elements would then be oriented "above" the other elements. The exemplary term "below," therefore, encompasses both an orientation of above and below.

It will be understood that although the terms "first" and "second" are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second without departing from the teachings of the present invention. As used herein the term "and/or" includes any and all combinations of one or more of the associated listed items. Like numbers refer to like elements throughout.

FIGS. 1-4 illustrate exemplary operations for forming conductive structures, such as wiring and/or contacts, in a microelectronic substrate according to some embodiments of the present invention. Referring to FIG. 1, a dielectric layer 100 and a sacrificial layer 200 are formed on a substrate (not shown), and openings 110 formed therein in low density and high density pattern regions A, B. The sacrificial layer 200 includes a material that exhibits an etching selectivity with respect to the dielectric layer 100 in a subsequent etching process described below. For example, the dielectric layer 100 may include silicon nitride and/or silicon oxynitride, and the sacrificial layer may include silicon dioxide. It will be appreciated that the layers 100, 200 may be single layers or compound layers including multiple layers. The openings 110 may be formed using any of a number of different conventional techniques, such as by etching using a photolithographic mask. It will be understood that the openings formed in the layers 100, 200 may extend only partially into the dielectric layer 100, as might be the case in forming a wiring pattern, for example, and/or may extend through the dielectric layer 100 (as shown in dashed line) to expose an underlying structure, as might be the case in forming a contact for that underlying structure.

As further shown in FIG. 1, a conductive layer 300 is formed on the sacrificial layer 100, filling the openings 110. In general, the conductive layer 300 may include any of a number of different materials, including, but not limited to, metals, such as aluminum, titanium, copper, and tungsten, and/or metal-containing materials, such as metal silicides or metal nitrides, and/or non-metallic conductors, such as polysilicon. The conductive layer 300 may comprise a single layer or compound layers including, for example, ohmic transition layers, glue layers, contamination barrier layers, spacers, and the like.

Figure 2:
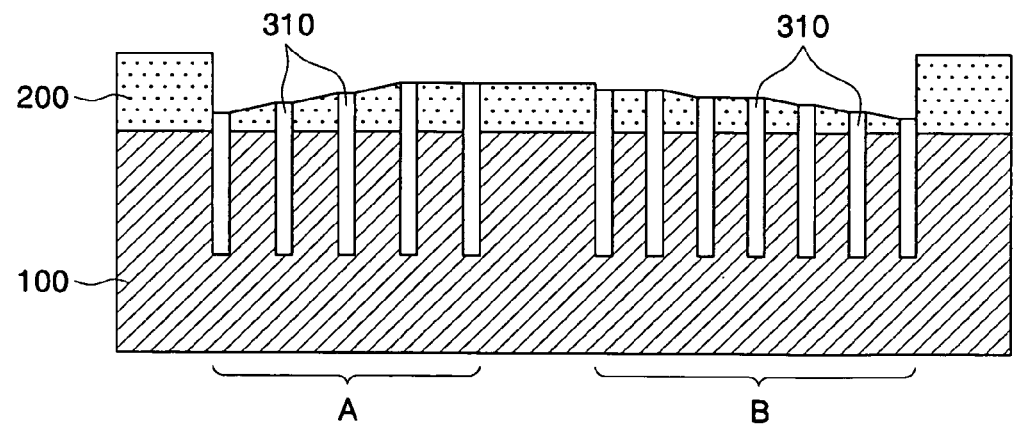

Referring to FIG. 2, a first CMP is performed to remove portions of the metal-containing layer 300 on the sacrificial layer 200 and leave conductive regions 310 in the sacrificial layer 200 and the dielectric layer 100. As shown, the CMP may erode portions of the sacrificial layer 200, and the conductive regions 310 may be significantly non-uniform in extent.

Figure 3:
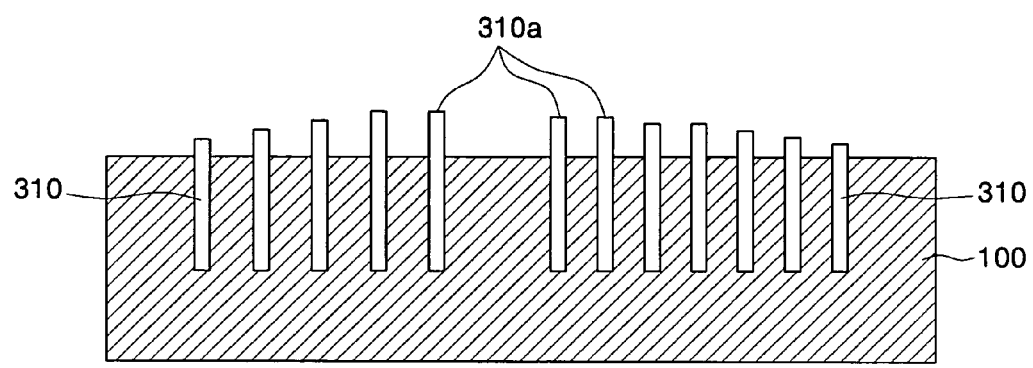

Referring to FIG. 3, the sacrificial layer 200 is etched (e.g., dry or wet etched) away to expose the dielectric layer 100, leaving portions 310a of the conductive regions 310 protruding from the dielectric layer. An ashing process using an oxygen plasma and subsequent cleaning using, for example, a dilute HF solution, may be performed after this etching to remove polymer residues that may remain on the dielectric layer 100. Such residues may have their source in particles left on the substrate by polymer polishing pads used in the preceding CMP.

Figure 4:
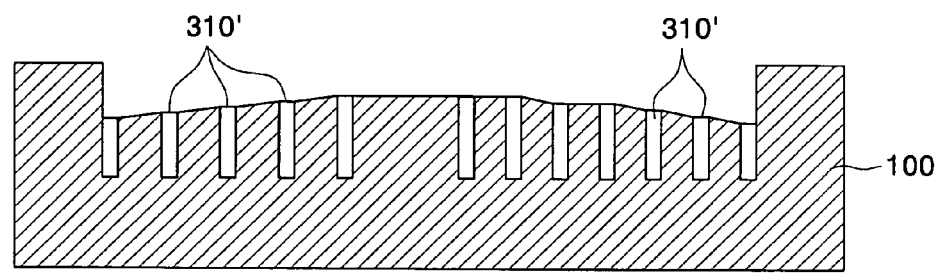

Referring to FIG. 4, a second CMP is performed to remove the protruding portions 310a of the conductive regions 310, leaving reduced-size conductive regions 310' in the dielectric layer 100. As shown, some erosion of the dielectric layer 100 and non-uniformity in the conductive regions 310' may occur as a result of this second CMP. However, it is believed that, because the second CMP process can be highly selective of the exposed protruding portions 310a of the conductive regions 310, the degree of erosion of dielectric layer 100 can be limited to an acceptable level. Accordingly, the size of the conductive regions 310' may be more uniform using the above-described process, which includes two CMP processes and an intervening etching process, in comparison to a conventional single-CMP approach. To prepare the resulting structure for further fabrication operations, for example, formation of one or more chalcogenide regions on the conductive regions 310' as would be done in fabricating a phase-change memory device, polymer residues may be removed by an oxygen plasma ashing process and a subsequent cleaning using, for example, an HF solution.

FIGS. 5-12 illustrate additional aspects of the present invention, showing how a multiple-CMP process with intermediate etching of a sacrificial layer along the lines described above may be particularly advantageous in forming a very small structure, such as a small contact for a phase-change memory device, and how use of a sacrificial layer, such as a sacrificial layer used in the multi-CMP procedure described, can allow a desirably narrow contact to be formed. In particular, FIGS. 5-12 illustrate a phase-change memory device and fabrication operations therefor that include two CMP operations with an intermediate etching operation along the lines described above according to further embodiments of the present invention. It will be appreciated that, although the fabrication operations and structures formed thereby illustrated in FIGS. 5-12 illustrate how a fabrication process such as that described above with reference to FIGS. 1-4 may be particularly advantageous for forming a phase-change memory device, the embodiments of FIGS. 5-12 are provided for purposes of illustration, and the present invention is not limited to such embodiments.

Figure 5:
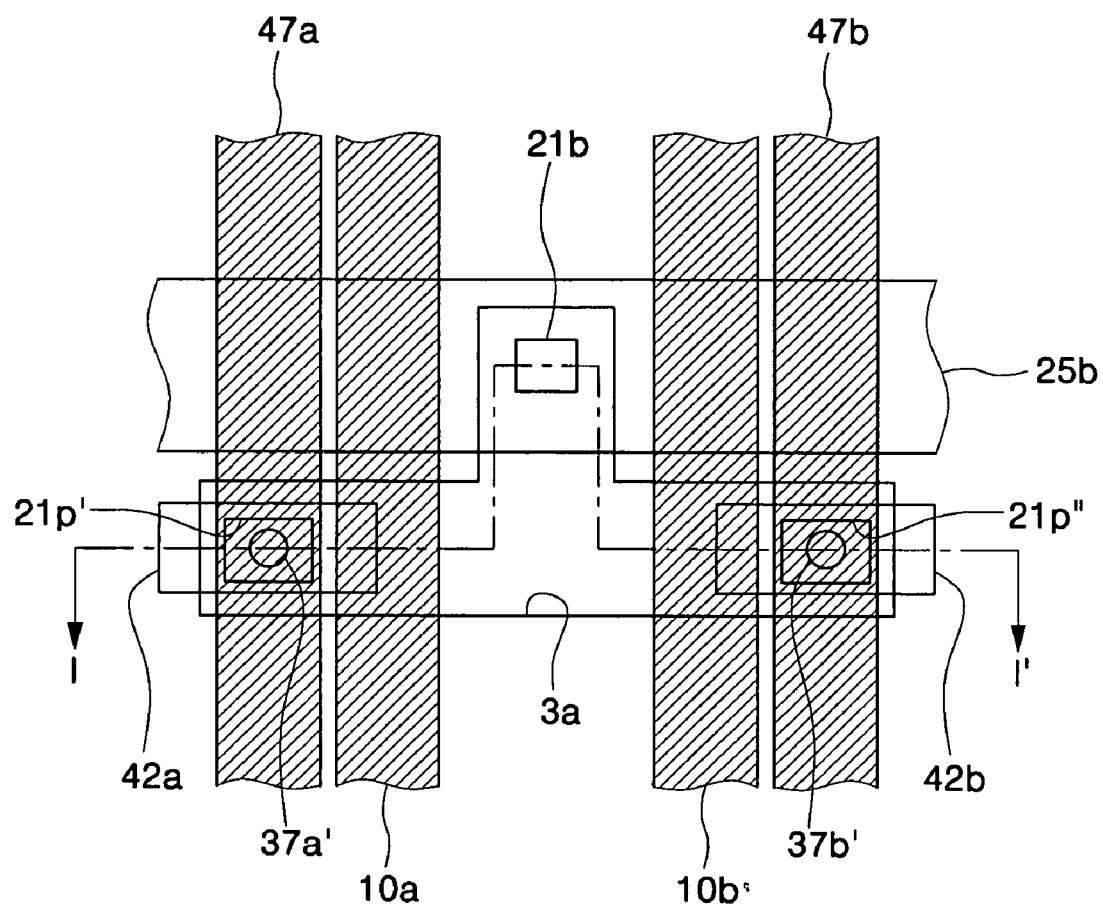
FIGS. 5 and 6 are plan and cross-sectional views, respectively, of a phase-change memory device according to some embodiments of the present invention.
Figure 6:
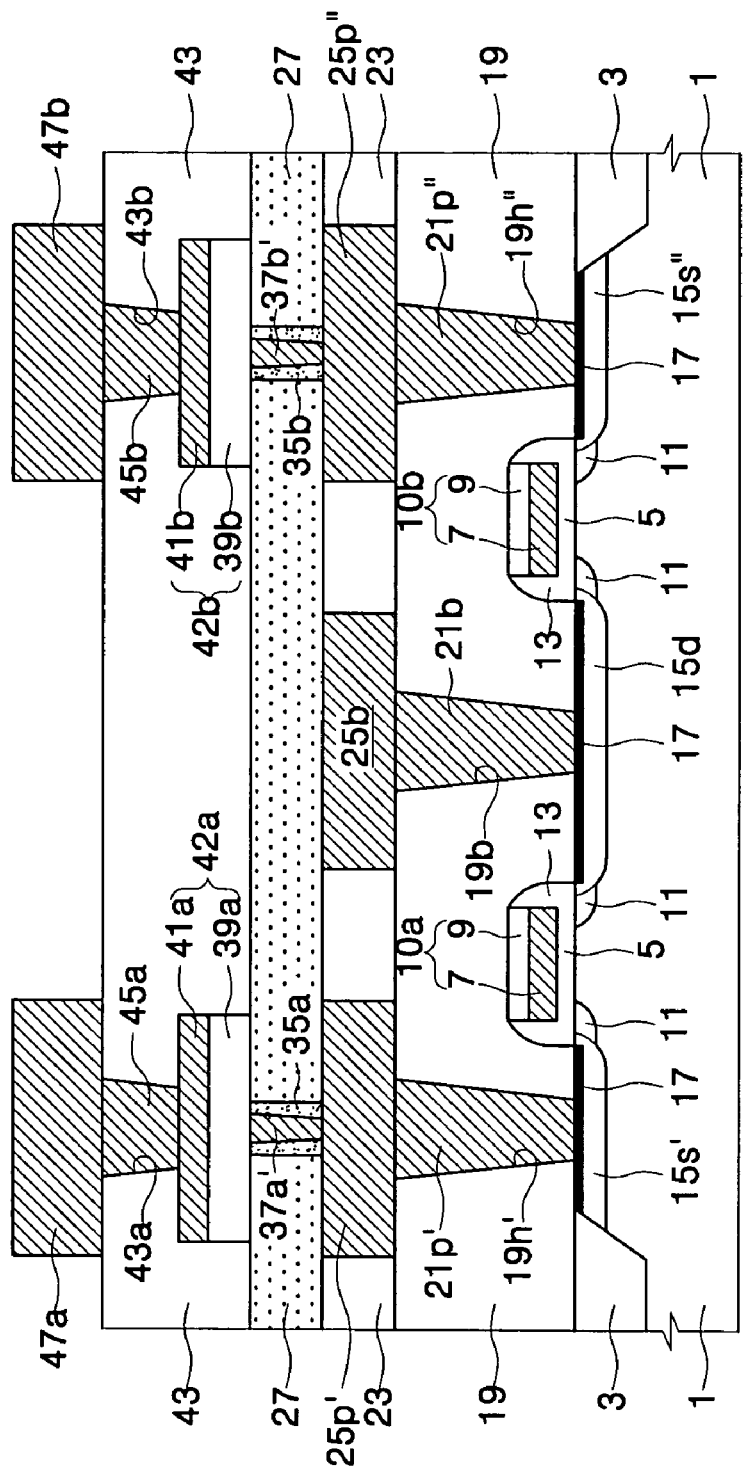

FIGS. 5 and 6 are a plan view and a cross-sectional view, respectively, of a phase-change memory device according to some embodiments of the present invention, with the cross-sectional view of FIG. 6 corresponding to a section taken along a line I-I' shown in FIG. 5. The device includes a semiconductor substrate 1 in which source/drain regions 15s', 15d, 15s'" are formed between isolation regions 3 in the substrate 1. As shown, the source/drain regions 15s', 15d, 15s'" include lightly doped regions 11 and have respective metal silicide layers 17 formed thereon. Gate structures 10a, 10b are disposed between respective pairs of the source/drain regions 15s', 15d, 15s'" and include a gate insulation layer 5, a gate electrode layer 7, a capping layer 9 and sidewall spacers 13.

A first interlayer dielectric layer 19 is disposed on the substrate 1. Conductive plugs 21p', 21b, 21p" pass through openings 19h', 19b, 19h" in the first interlayer dielectric 19, contacting the metal silicide layers 17 on respective ones of the source/drain regions 15s', 15d, 15s'". A second interlayer dielectric layer 23 is disposed on the first interlayer dielectric 19, and conductive pads 25p', 25p" and a bit line 25b therein contact respective ones of the conductive plugs 21p', 21p", 21b.

A third dielectric layer 27 is disposed on the second dielectric layer 23. Conductive small contact plugs 37a', 37b pass through the third dielectric layer 23 and contact respective ones of the conductive pads 25p', 25p" through openings having sidewall spacers 35a, 35b therein. Phase-changeable (e.g., chalcogenide) material regions 39a, 39b are disposed on respective ones of the small contact plugs 35a, 35b, and upper electrodes 41a, 41b are disposed on respective ones of the phase-changeable material regions 39a, 39b. The phase-changeable material regions 39a, 39b and the upper electrodes 41a, 41b are surrounded by another interlayer dielectric layer 43. Conductive contact plugs 45a, 45b contact respective ones of the upper electrodes 41a, 41b through respective openings 43a, 43b in the interlayer dielectric layer 43. Respective plate lines 47a, 47b are disposed on respective ones of the contact plugs 45a, 45b. It will be appreciated that the gate structures 10a, 10b and the source/drain regions 15s', 15d, 15s'" form respective transistors that can be used to control current flow through the respective phase-changeable material regions 39a, 39b, which serve as information storage elements.

Figure 7:
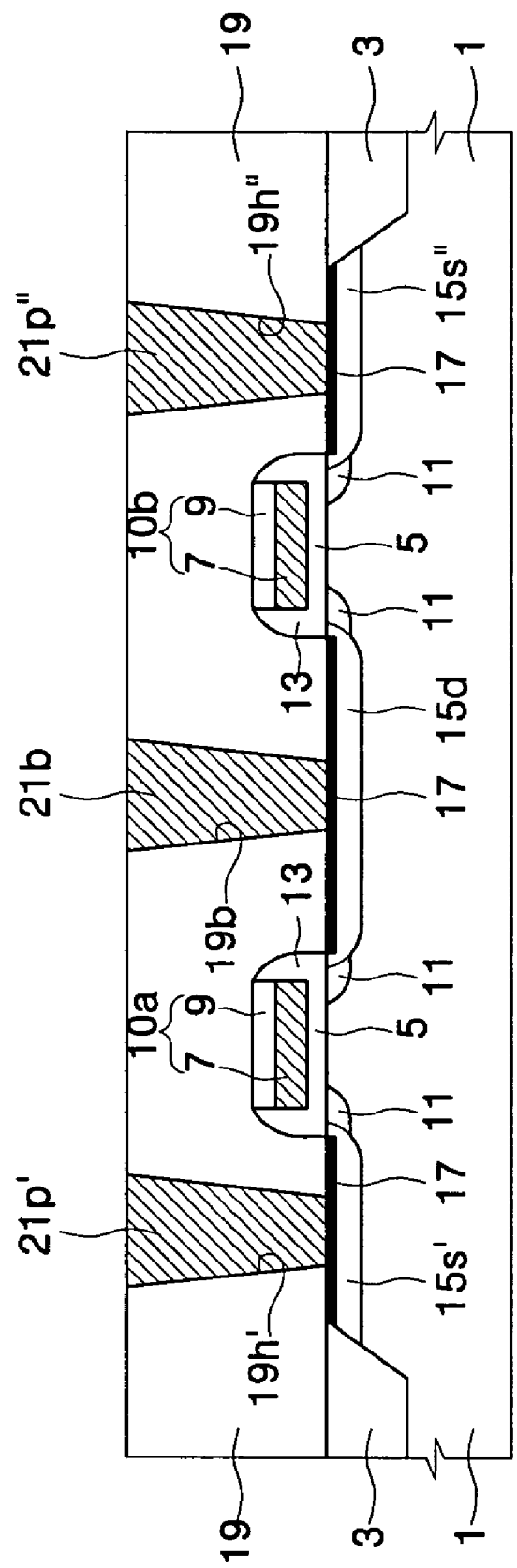
FIGS. 7-12 are cross-sectional views of intermediate fabrication products illustrating exemplary operations for forming the device of FIGS. 5 and 6 according to further embodiments of the present invention.
Figure 8:
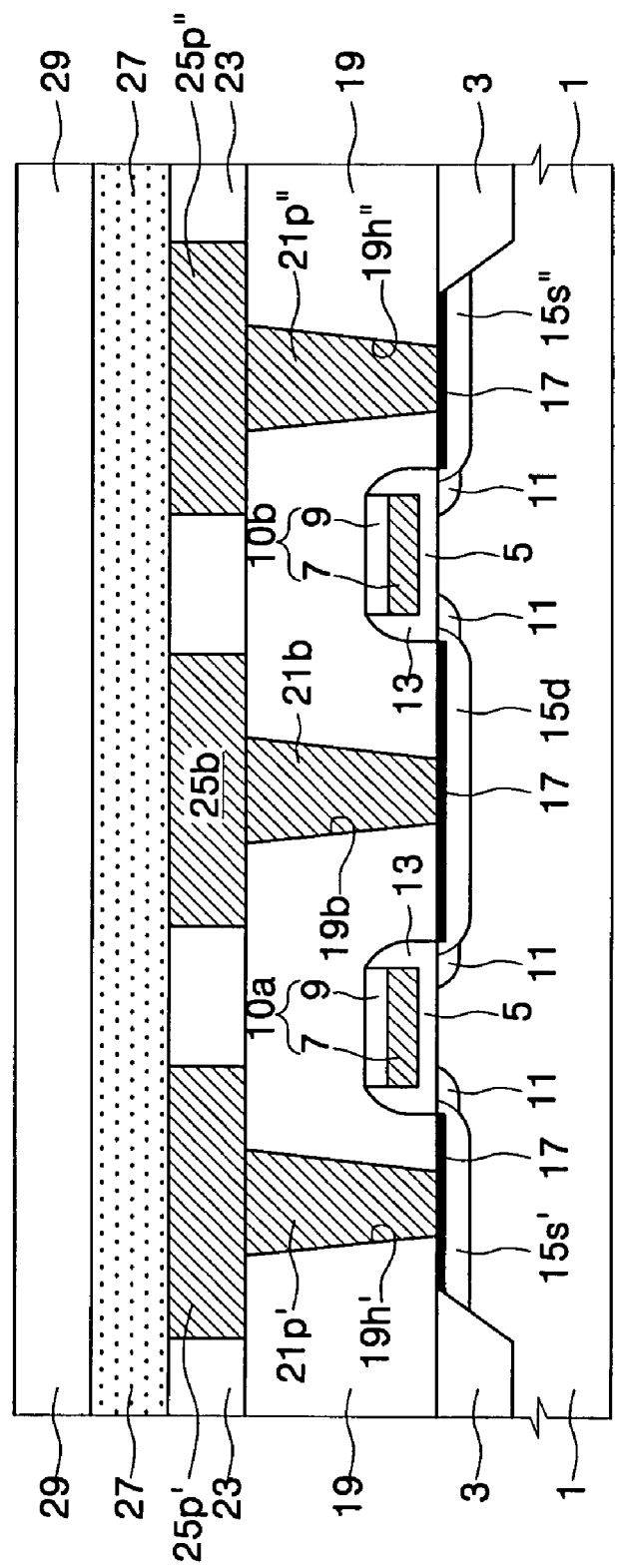

Exemplary operations for fabricating the device illustrated in FIGS. 5 and 6 will now be explained with reference to FIGS. 7-12. Referring to FIG. 7, isolation regions 3 are formed in the semiconductor substrate 1 to define an active region. Such isolation regions may be, for example, conventionally formed trench and/or field oxide regions. Spaced-apart gate structures 10a, 10b may be formed on the substrate 1 in a conventional manner, and include a gate insulation (e.g., silicon oxide) layer 5, a conductive (e.g., polysilicon and/or metal) gate electrode layer 7, an insulating (e.g., silicon oxide, silicon nitride and/or silicon oxynitride) capping layer 9 and insulating (e.g., silicon oxide, silicon nitride and/or silicon oxynitride) sidewall spacers 13. The source/drain regions 15s', 15p, 15s'" (including the lightly doped regions 11) may also be formed in a conventional fashion, e.g., by impurity ion implantations using various parts of the gate structures 10a, 10b as masks. The metal silicide layers 17, the interlayer dielectric layer 19 and the contact plugs 21p', 21b, and 21p" may also be formed conventionally. Referring to FIG. 8, the dielectric layer 23 may be formed using, for example, conventional deposition techniques, and the contact pads 25p', 25p" and bit line 25 may be formed using, for example, conventional patterning, deposition, and planarization techniques.

A dielectric layer 27 and a sacrificial layer 29 are sequentially formed on the dielectric layer 23. The dielectric layer 27 preferably is a material that is more etch-resistant than the sacrificial layer 29 in a subsequent intermediate etching process described in detail below. Also, it is preferable that the dielectric layer 27 be a material of sufficient resistance to erosion in a CMP process that is performed after the etching. For example, the dielectric layer 27 may be a silicon nitride and/or silicon oxynitride layer, and the sacrificial layer 29 may be a silicon dioxide layer. It will be appreciated, however, that other combinations of materials be used for the dielectric and sacrificial layers 27, 29.

Figure 9:
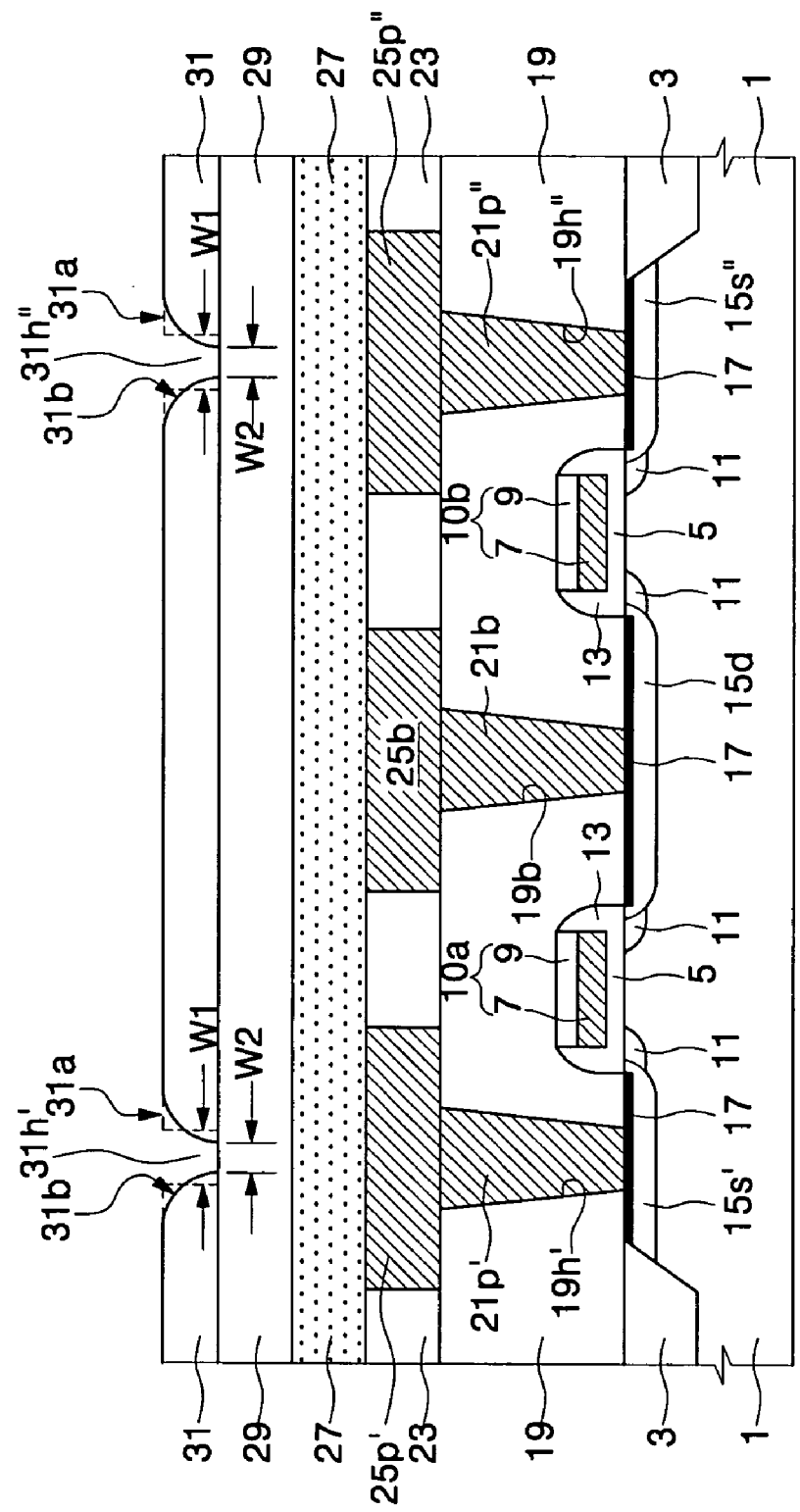

Referring to FIG. 9, a photoresist layer is formed on the sacrificial layer 29, and patterned to form a mask 31 with openings 31h', 31h" therein that expose underlying portions of the sacrificial layer 29. As shown in FIG. 9, the patterned photoresist layer 31 may be reflowed (e.g., at about 250° C. to about 350° C.) to reduce the width of the openings 31h', 31h" from a first width W1 to a second width W2 by rounding shoulder portions 31a, 31b of the pattern 31.

Figure 10:
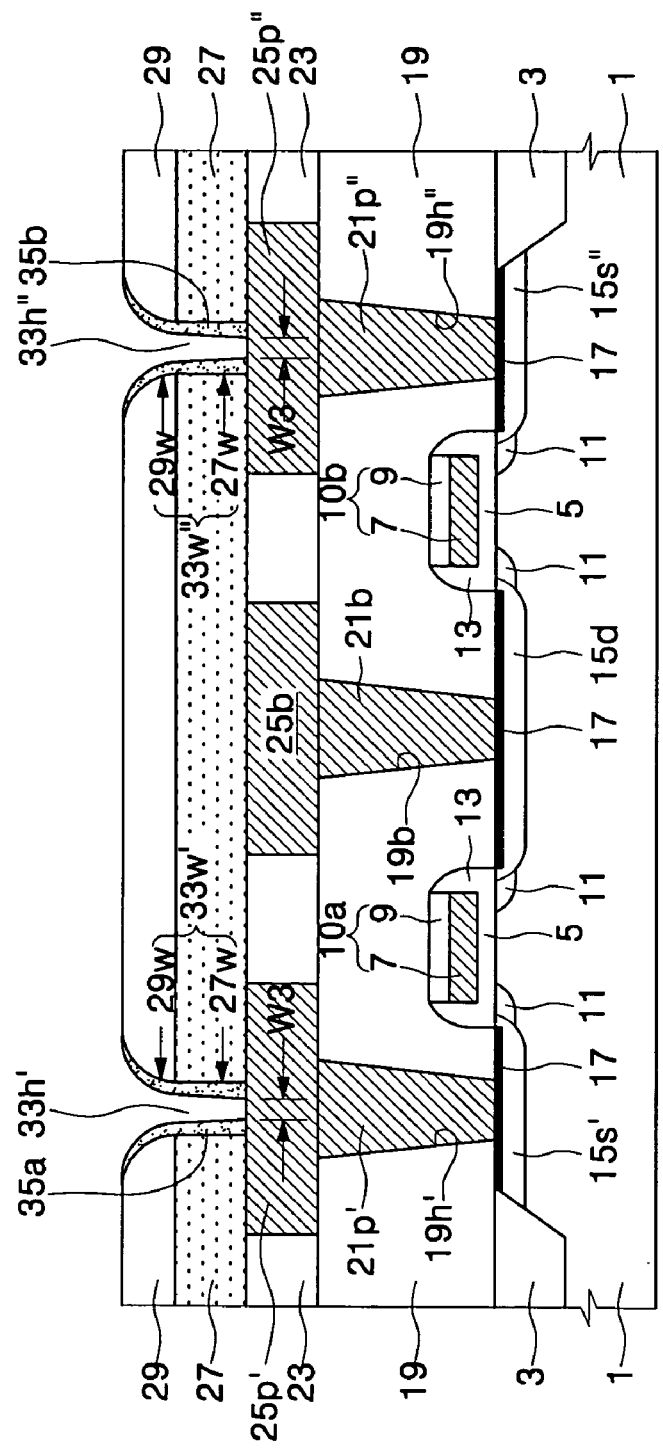

As illustrated by FIG. 10, the sacrificial layer 29 and the dielectric layer 27 are etched using the photoresist pattern 31 as a mask, exposing top portions of the pads 25p', 25p" through openings 33h', 33h". Sidewall spacers 35a, 35b may be formed on sidewalls 33w', 33w" of the openings 33h', 33h" by removing the photoresist pattern 31, depositing, for example, silicon nitride and/or silicon oxynitride on the sacrificial layer 27 and into the openings 33h', 33h", and etching to remove portions of the deposited material from the surface of the sacrificial layer 29 and the bottom of the openings 33h', 33h". As the spacers 35a, 35b serve to further narrow the openings 33h', 33h", the previously described reflowing of the photoresist pattern 31 may be omitted if the spacers 35a, 35 produce sufficiently narrow openings. Similarly, formation of the spacers 35a, 35b may be omitted if the reflow of the photoresist provides sufficient narrowing. In some embodiments, both operations may be performed.

As also shown in FIG. 10, the use of two layers 27, 29 results in the sidewalls 33w', 33w" of the holes 33h', 33h" including sidewalls 27w, 29w of the dielectric layer 27 and the sacrificial layer 29, respectively. The openings 33h', 33h" are generally flared, with a greater amount of flaring being present near the tops of the openings 33h', 33h" in the sidewalls 29w of the sacrificial layer 29. The maximum width W3 of the openings 33h', 33h" at the sidewalls 27w of the dielectric layer 27 is generally less than the maximum width at the sidewalls 29w of the sacrificial layer 29.

Figure 11:
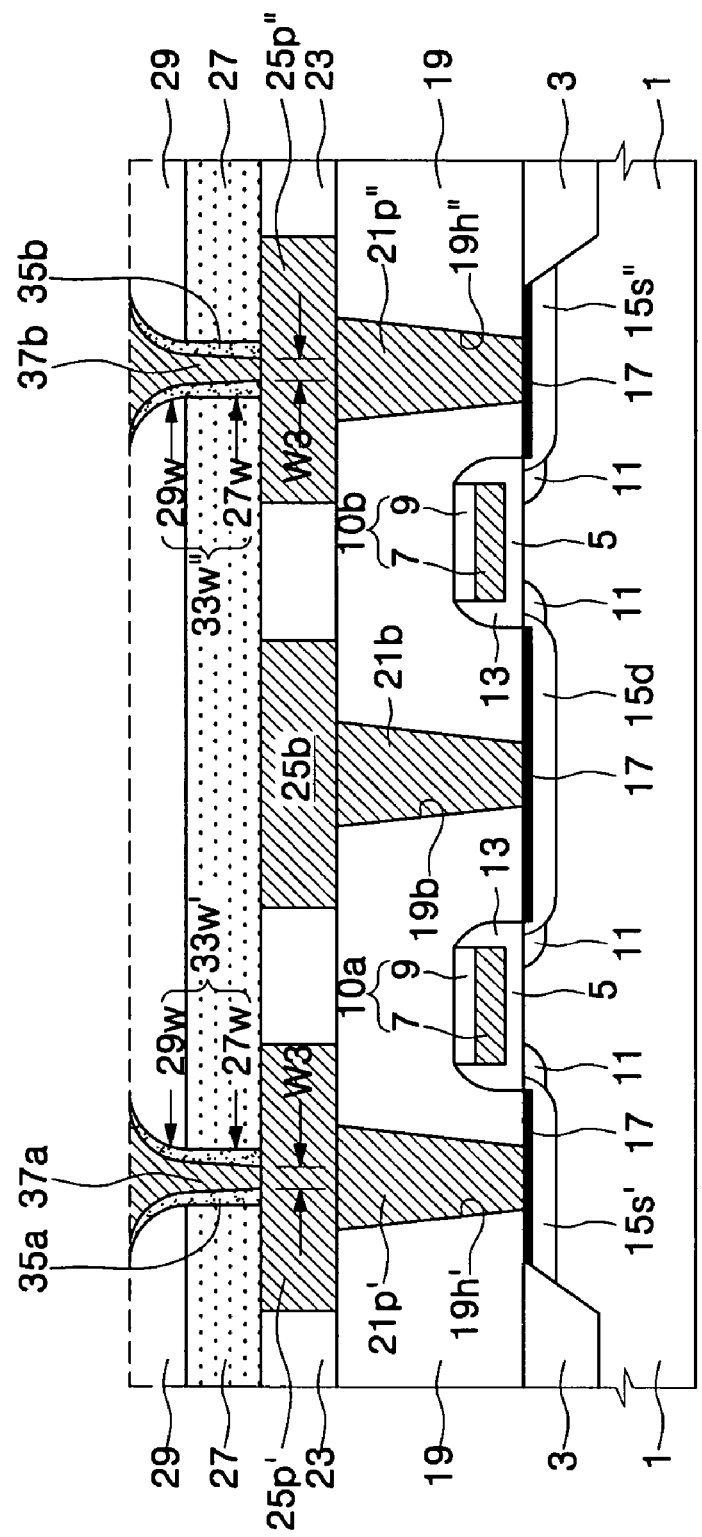

Referring to FIG. 11, a conductive material, such as titanium nitride, is deposited on the sacrificial layer and into the openings 33h', 33h", and a first CMP operation is performed to remove portions of the conductive layer and expose the sacrificial layer 29, thus forming conductive small contact plugs 37a, 37b in the openings 33h', 33h". The sacrificial layer 29 is then removed by etching (e.g., dry etching) to expose the dielectric layer 27. For the illustrated embodiments, a dry etching using an isotropic process is preferable. The etching leaves portions of the plugs 37a, 37b and the sidewall spacers 35a, 35b protruding from the dielectric layer 27. Polymer residue present on the surface of the dielectric layer 27 may be removed by ashing with an oxygen plasma, and cleaning with an HF solution.

Figure 12:
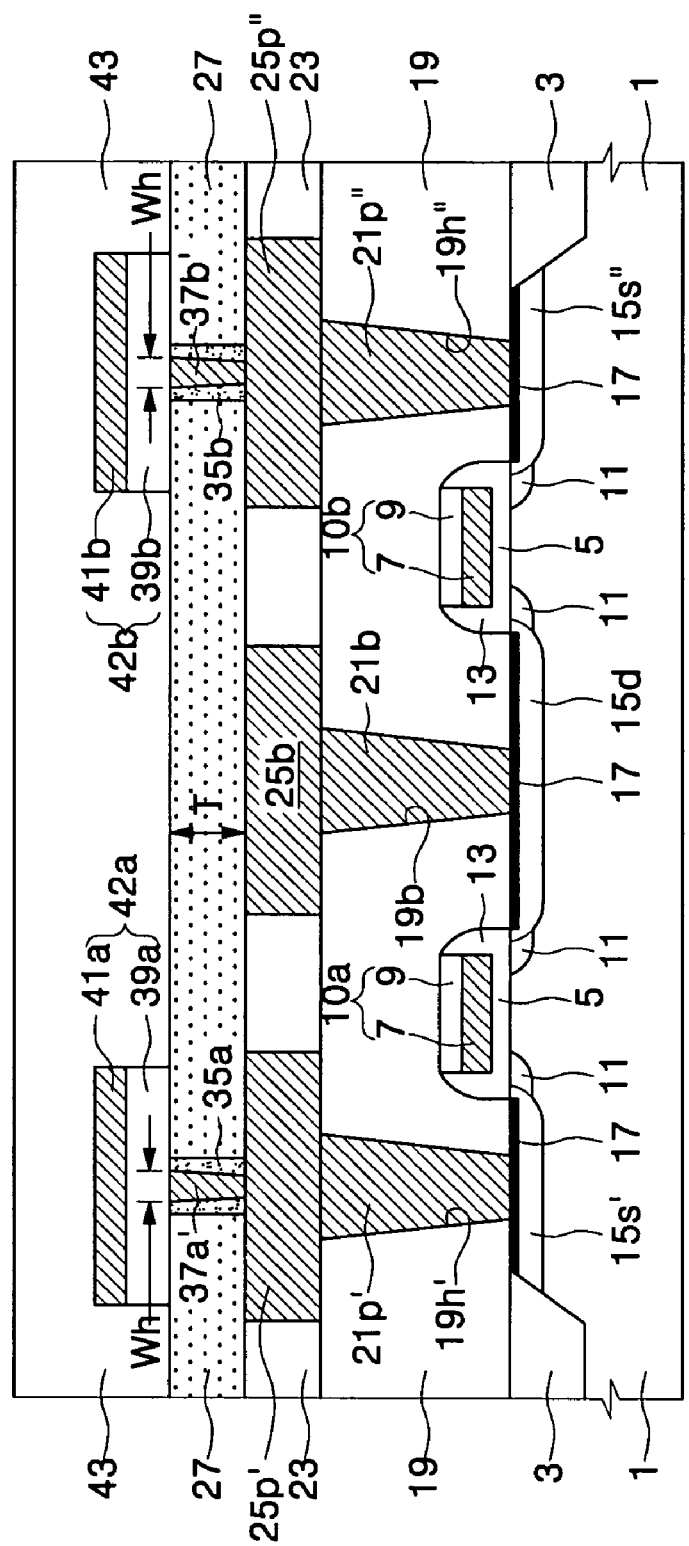

Referring to FIG. 12, the protruding portions of the plugs 37a, 37b and the sidewall spacers 35a, 35b may then be removed with a second CMP operation to produce reduced-size small contact plugs 37a', 37b'. Through the use of the sacrificial layer 29 to reduce the flaring of the contact hole and a contact formation process that involves two CMP steps with an intermediate etching, the plugs 37a', 37b' may have a desirable and more uniform narrowness Wh. Phase-changeable material regions 39a, 39b, upper electrodes 41a, 41b and interlayer dielectric layer 43 may be formed on the plugs 37a', 37b' using conventional processes.

The present invention may provide many advantages. In the illustrated phase-change memory fabrication described above, small contact plugs may be more precisely and uniformly fabricated. In addition, the use of a two-CMP process with intermediate etching can improve planarity by reducing effects such as edge over-erosion. Thus, for example, even though an addition CMP process is performed, reduction in edge over-erosion can allow subsequent planarization steps to be avoided. In other applications, the use of sacrificial layers and/or a multi-CMP process as described above can allow other structures, such as wiring patterns, contacts or vias, to be more precisely fabricated, and can also maintain planarity for photolithographic alignment and other purposes.

Referring again to FIG. 6, a single CMP step may be used to form the upper electrode contact plugs 45a and 45b. However, when the upper electrode contact plugs 45a and 45b are formed using a single CMP step, non-uniform polishing characteristics may be exhibited due to a pattern density difference between cell array region and peripheral circuit regions. In particular, because stress may occur at an edge of the cell array region during the CMP, the upper electrode contact plugs 45a and 45b may have non-uniform heights.

A conductive layer from which the upper electrodes 41a and 41b are formed may be deposited using a low power physical vapor deposition technique in order to minimize the damage applied to the phase-change material patterns 39a and 39b. Because the upper electrodes 41a and 41b may have a soft film quality, it may be difficult to over-etch the upper interlayer insulating layer 43 during formation of the plate line contact holes 43a and 43b. Accordingly, when an alignment key trench region is simultaneously formed with the plate line contact holes 43a and 43b in a portion of the upper interlayer insulating layer in order to form an alignment key for use in a subsequent photolithography process, it may be difficult to increase the depth of the alignment key trench region. To increase the depth of the alignment key trench region, the thickness of the upper interlayer insulating layer 43 could be increased. However, if the thickness of the upper interlayer insulating layer 43 is increased, it may be difficult to form upper electrode contact plugs having a uniform height in the cell array region because of non-uniform polishing characteristics of the CMP step, as previously described.

Figure 13:
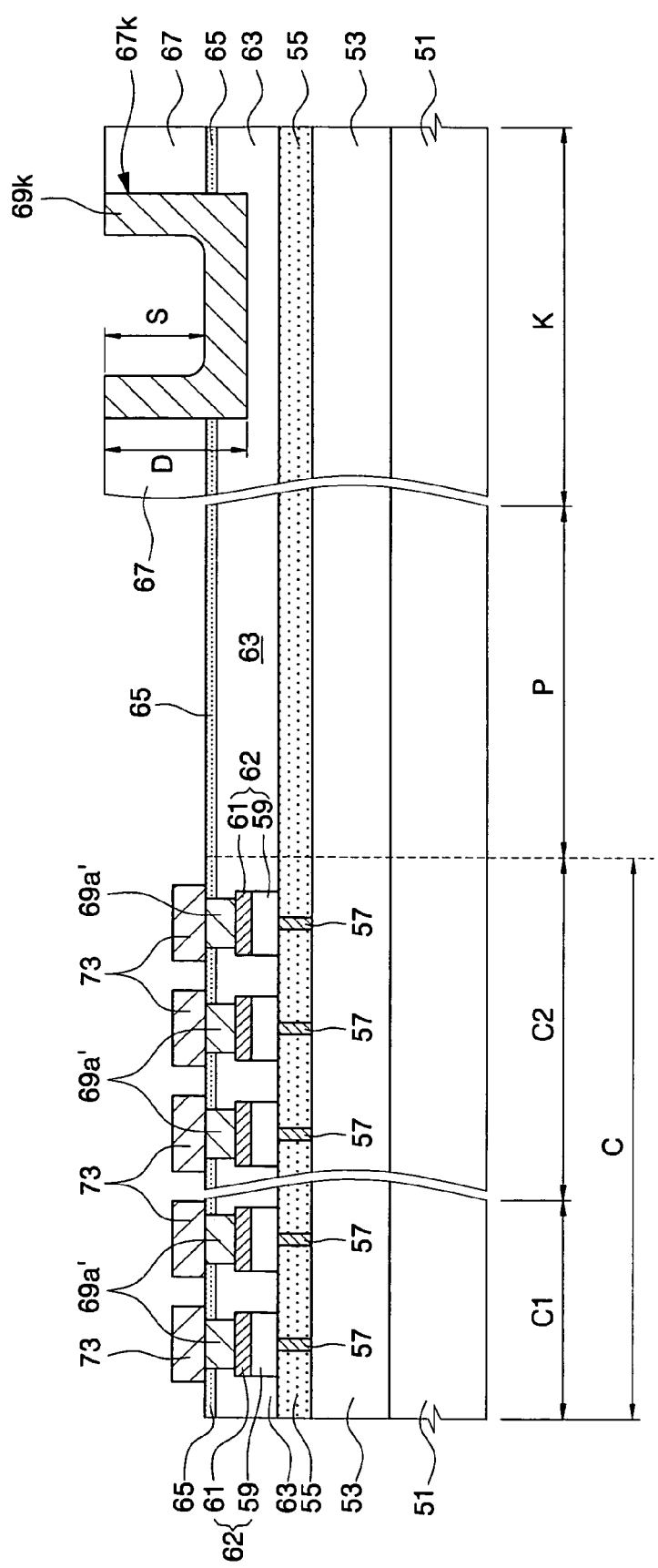
FIG. 13 is a cross-sectional view of a phase-change memory device according to additional embodiments of the present invention.

FIG. 13 illustrates phase-change memory device according to further embodiments of the present invention. An interlayer insulating layer 53 is disposed on a semiconductor substrate 51. The semiconductor substrate 51 includes a cell array region C, a peripheral circuit region P surrounding the cell array region C and an alignment key region K adjacent to the peripheral circuit region P. The cell array region C has a central region C1 and an edge region C2, and the alignment key region K may correspond to a scribe lane between main chips. Cell transistors (not shown) and peripheral circuit transistors (not shown) may be disposed on and/or in the semiconductor substrate 51, and the interlayer insulating layer 53 may cover the transistors. A protection layer 55 is disposed on the interlayer insulating layer 53. The protection layer 55 may be, for example, a silicon nitride layer and/or a silicon oxynitride layer. A plurality of lower electrodes 57 pass through the protection layer 55 in the cell array region C. The lower electrodes 57 may comprise, for example, titanium nitride. A plurality of data storage elements 62 are disposed on the lower electrodes 57. Each of the data storage elements 62 includes a data storage material pattern 59 and an upper electrode 61. The data storage material pattern 59 may be, for example, a phase-change material pattern, such as a chalcogenide layer. An inter-metal insulating layer 63 is provided around the data storage elements 62. It is preferable that the inter-metal insulating layer 63 is a planarized insulating layer having a substantially flat top surface.

A barrier layer 65 is disposed on the inter-metal insulating layer 63. The barrier layer 65 may act as at least one of an etch-stop layer, a CMP stop layer, an impurity blocking layer and/or a stress buffer layer, as described in greater detail below. The upper electrodes 61 are electrically connected to upper electrode contact plugs 69a' that pass through the barrier layer 65 and the inter-metal insulating layer 63 and have a substantially uniform height. The upper electrode contact plugs 69a' may have a width greater than the lower electrodes 57. The upper electrode contact plugs 69a' may comprise a metal, such as tungsten, titanium nitride, titanium aluminum nitride (TiAlN), tantalum nitride and/or a titanium tungsten (TiW).

A sacrificial layer 67 may be disposed on the barrier layer 65 in the alignment key region K. An alignment key trench region 67k passes through at least the sacrificial layer 67 and the barrier layer 65 and extends into the inter-metal insulating layer 63. The alignment key trench 67k thus may have a depth greater than a total thickness of the sacrificial layer 67 and the barrier layer 65. An inner wall of the alignment key trench 67k is covered with an alignment key 69k having a surface step difference S. The surface step difference S of the alignment key 69k may depend on a depth D of the alignment key trench region 67k, i.e., the step difference S may depend on the thickness of the sacrificial layer 67. Accordingly, if the thickness of the sacrificial layer 67 is increased, the alignment key 69k may have a sufficient surface step difference to prevent misalignment from occurring during a subsequent photolithography process. The alignment key 69k may be the same material layer as the upper electrode contact plugs 69a'. Plate lines 73 contact the upper electrode contact plugs 69a' in the cell array region C.

Figure 14:
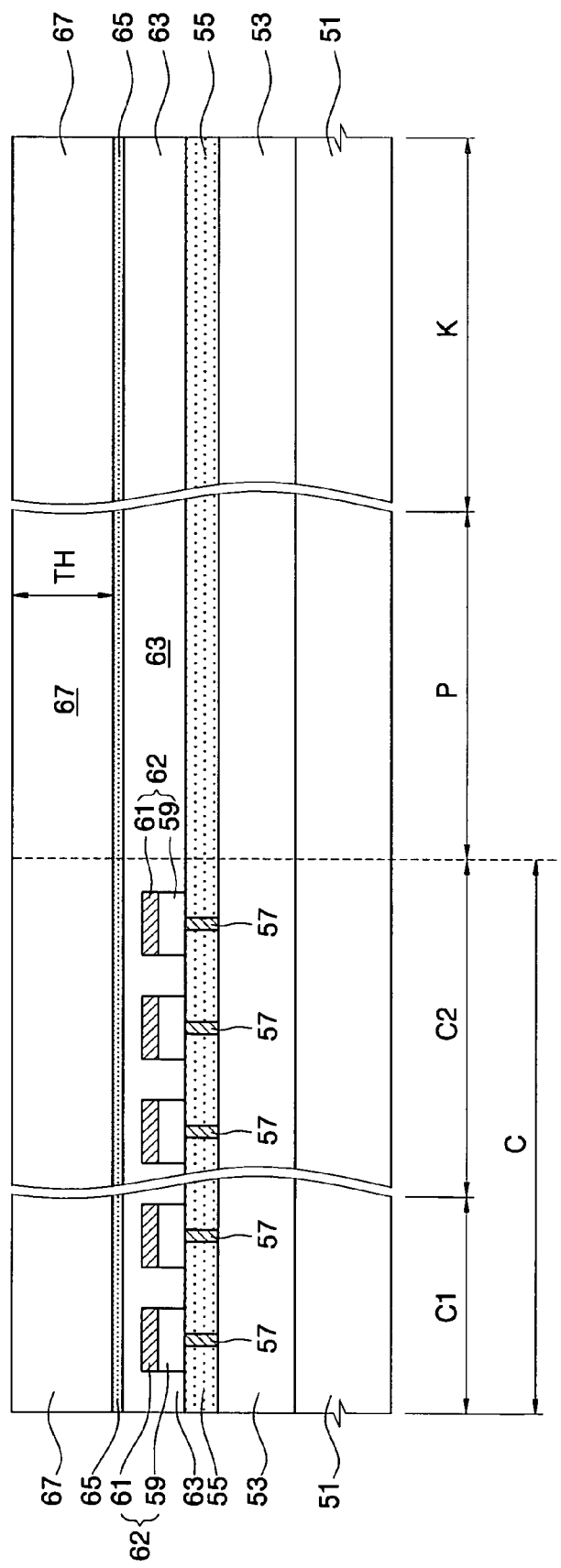
FIGS. 14-17 are cross-sectional views of intermediate fabrication products illustrating exemplary operations for forming the phase-changeable memory device of FIG. 13.

FIGS. 14 through 17 are cross-sectional views illustrating exemplary operations for fabricating the memory device of FIG. 13 according to further embodiments of the present invention. Referring to FIG. 14, an interlayer insulating layer 53 is formed on a semiconductor substrate 51. The semiconductor substrate 51 includes a cell array region C, a peripheral circuit region P surrounding the cell array region C and an alignment key region K adjacent to the peripheral circuit region P. The cell array region C has a central region C1 and an edge region C2, and the alignment key region K may be located in a scribe lane between main chips. Cell transistors (not shown) and peripheral circuit transistors (not shown) may be formed in and/or on the semiconductor substrate 51 using conventional techniques prior to formation of the interlayer insulating layer 53.

A protection layer 55 is formed on the interlayer insulating layer 53, and a plurality of lower electrodes 57 pass through the protection layer 55 in the cell array region C. The protection layer 55 and the lower electrodes 57 may be formed, for example, using techniques along the lines described above with reference to FIGS. 1-12. A plurality of data storage elements 62 is formed on the protection layer 55 in the cell array region C. The data storage elements 62 may be also formed using techniques along the lines described above. As shown, each of the data storage elements 62 includes a data storage material pattern 59 and an upper electrode 61 thereon. The respective data storage material patterns 59 cover the respective lower electrodes 57.

An inter-metal insulating layer 63 is formed on the substrate, around and on the data storage elements 62. The inter-metal insulating layer 63 may comprise, for example, a silicon oxide layer, such as an undoped silicate glass (USG) layer. Preferably, the inter-metal insulating layer 63 is planarized to provide a substantially flat top surface. A barrier layer 65 and a sacrificial layer 67 are sequentially formed on the inter-metal insulating layer 63. It is preferable that the sacrificial layer 67 is formed of a material layer having an etch selectivity with respect to the barrier layer 65. The barrier layer 65 may be formed of a material layer suitable for use as an etch-stop layer, a chemical mechanical polishing (CMP) stop layer, an impurity blocking layer and/or a stress buffer layer. For example, if the barrier layer 65 is used as an etch-stop layer and/or a CMP stop layer, the barrier layer 65 may comprise a silicon nitride layer and/or a silicon oxynitride layer and the sacrificial layer 67 may comprise a silicon oxide layer. If the barrier layer 65 is to serve as an impurity blocking layer that prevents (or reduces) impurities, such as external hydrogen atoms or oxygen atoms, from penetrating into the data storage elements 62, the barrier layer 65 may comprise a silicon nitride layer, an aluminum oxide layer and/or a titanium oxide layer, and the sacrificial layer 67 may comprise a silicon oxide layer. If it is desired for the barrier layer 65 to serve as a stress buffer layer for relieving physical stresses of the inter-metal insulating layer 63 and the sacrificial layer 67, the barrier layer 65 may comprise a material layer having a stress opposite that of the inter-metal Insulating layer 63 and the sacrificial layer 67. For example, if the inter-metal insulating layer 63 and the sacrificial layer 67 comprise an undoped silicate glass (USG) layer providing tensile stress, the barrier layer 65 may comprise a silicon nitride layer providing compressive stress. The sacrificial layer 67 may be formed to a thickness TH of several thousand Å to a few μm.

Figure 15:
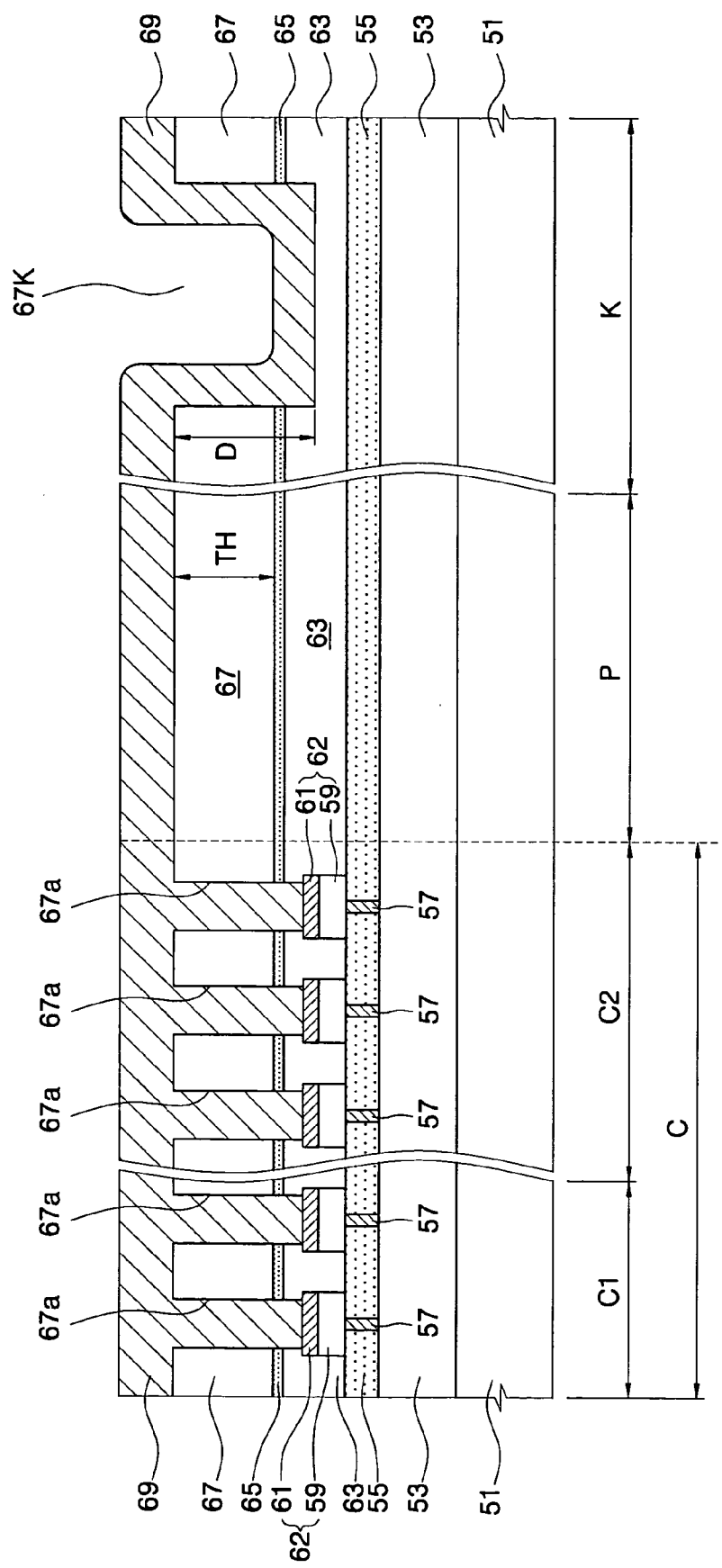

Referring to FIG. 15, the sacrificial layer 67, the barrier layer 65 and the inter-metal insulating layer 63 are patterned to form a plurality of plate line contact holes 67a that expose the upper electrodes 61. The plate line contact holes 67a may be have a greater width than the lower electrodes 57. An alignment key trench 67k may be formed in the alignment key region K during formation of the plate line contact holes 67a. The depth D of the alignment key trench region 67k may be greater than the thickness TH of the sacrificial layer 67. The depth D of the alignment key trench 67k may depend on the thickness TH of the sacrificial layer 67.

A conductive plug layer 69 is formed, filling the plate line contact holes 67a and conforming to inner surfaces of the alignment key trench 67k. The conductive plug layer 69 may comprise a metal layer, such as a tungsten layer, a titanium nitride layer, a titanium aluminum nitride (TiAlN) layer, a tantalum nitride layer and/or a titanium tungsten (TiW) layer.

Figure 16:
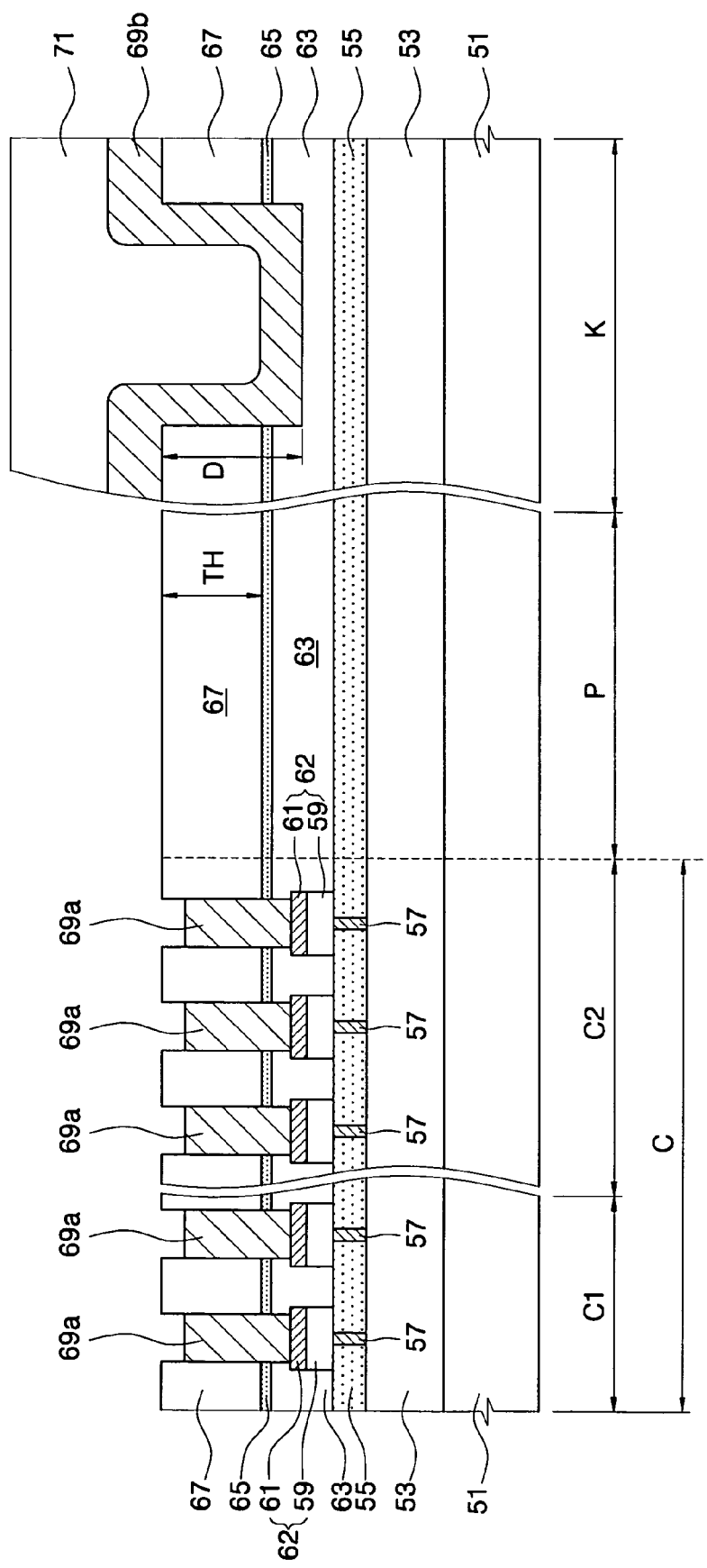

Referring to FIG. 16, a photoresist pattern 71 is formed over the conductive plug layer 69 in the alignment key region K. The conductive plug layer 69 is etched back using the photoresist pattern 71 as an etch mask to expose the sacrificial layer 67 in the cell array region C and the peripheral circuit region P. As a result, recessed contact plugs 69a are formed in the plate line contact holes 67a, and a conductive plug layer pattern 69b is formed in the alignment key region K. The conductive plug layer 69 may be etched back using a dry etching process and/or a wet etching process. If the conductive plug layer 69 comprises a tungsten layer, a wet etching process for etching back the conductive plug layer 69 may be carried out using a mixture of ammonium hydroxide ($NH_4OH$), hydrogen peroxide ($H_2O_2$), and de-ionized water.

Figure 17:
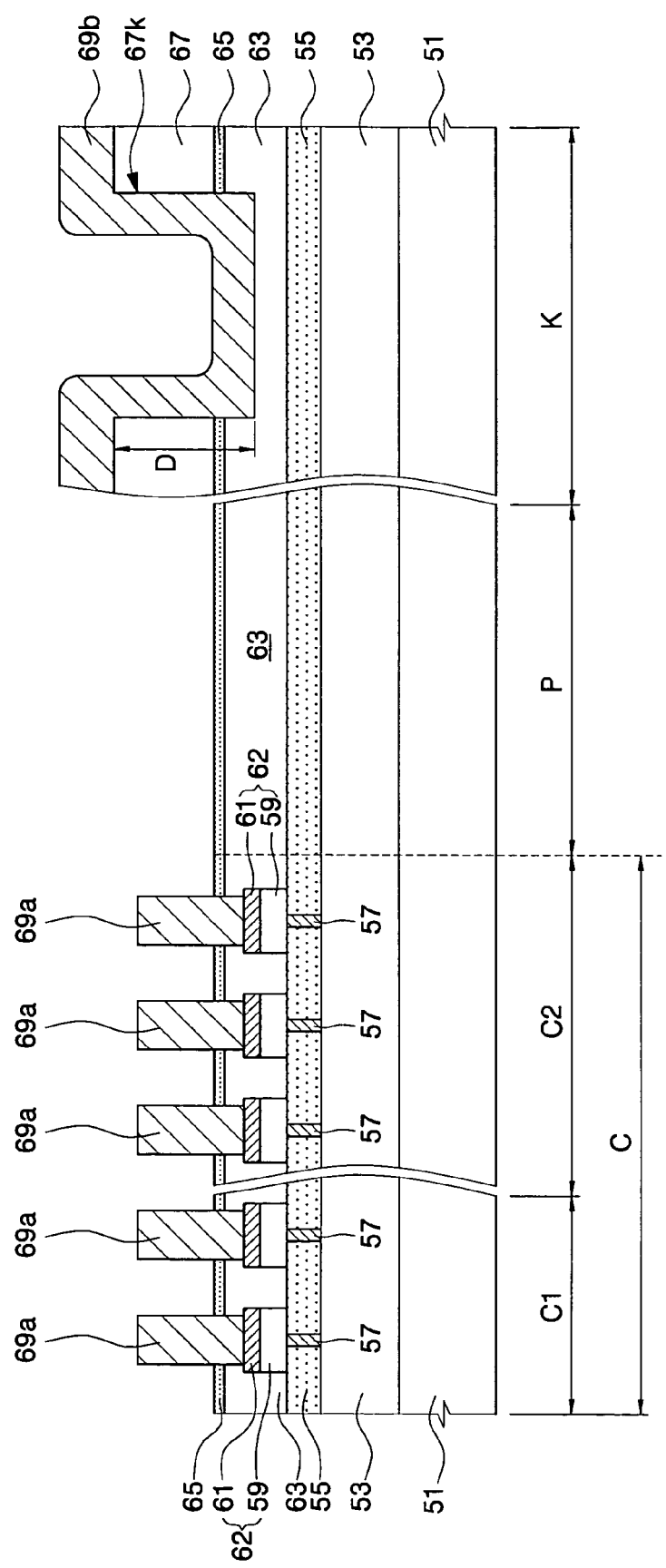

Referring to FIG. 17, the exposed sacrificial layer 67 in the cell array region C and the peripheral circuit region P may be removed using the photoresist pattern 71 as an etch mask, thus leaving the contact plugs 69a protruding above the barrier layer 65. Removal of the sacrificial layer 67 may be carried out using a dry etch-back process and/or a wet etch-back process, with the barrier layer 65 serving as an etch-stop layer. If the sacrificial layer 67 is removed using a dry etch-back process, a polymer residue may be formed on the surface of the substrate where the sacrificial layer 67 is etched back. This residue may be removed by an ashing process that uses an oxygen gas. After removal of the sacrificial layer 67, the photoresist pattern 71 may be removed.

Referring again to FIG. 13, the protruding portions of the contact plugs 69a are removed using CMP with the barrier layer 65 acting as a CMP stop layer. As a result, upper electrode contact plugs 69a' having substantially uniform height may be formed. The CMP may expose the top surface of the sacrificial layer 67 in the alignment key region K, leaving an alignment key 69k in the alignment key trench 67k. The alignment key 69k has a surface step difference S that depends on the depth D of the alignment key trench 67k. If the surface step difference S is greater than a certain value, it can prevent misalignment from occurring during a subsequent photolithography process that is performed using the alignment key 69k.

Subsequently, a conductive layer, such as a metal layer, is formed on the substrate having the upper electrode contact plugs 69a' and the alignment key 69k thereon, and the conductive layer may be patterned using a photolithography process and an etching process to form plate lines 73 that cover the upper electrode contact plugs 69a'. The photolithography process for forming the plate lines 73 may be performed using the alignment key 69k. According to the aforedescribed embodiments, it is possible to reduce misalignment when the photolithography process for formation of the plate lines 73 is performed, because the surface step difference S is sufficiently large to allow accurate registration.

In still further embodiments of the present invention, the upper electrode contact plugs 69a' may be formed using the same methods as the embodiments previously described, i.e., the upper electrode contact plugs 69a' may be formed using first and second chemical mechanical polishing processes with an intervening etch-back process. In more detail, after formation of the conductive plug layer 69 shown in FIG. 11, the conductive plug layer 69 is planarized using the first CMP process to expose the top surface of the sacrificial layer 67. As a result, the recessed contact plugs 69a may be formed in the cell array region C, as shown in FIG. 16. In this case, a preliminary alignment key 69k having the substantially the same surface step difference S as shown in FIG. 13 may be formed in the alignment key region K.

Subsequently, the exposed sacrificial layer 67 may be removed using a single etch-back step to protrude the contact plugs 69a and the alignment key 67k. The etch-back process for removing the exposed sacrificial layer 67 may be carried out using the barrier layer 65 as an etch-stop layer. The protruding portions of the contact plugs 69a and the alignment key 67k may then be removed using a second CMP process, with the barrier layer 65 acting as a polishing stop layer. As a result, upper electrode contact plugs (69a' in FIG. 14) having substantially uniform height throughout the cell array region C may be formed, and an alignment key having a desirable surface step difference. The surface step difference of the alignment key may be increased by increasing the thickness of the inter-metal insulating layer 63.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of fabricating an integrated circuit memory device, the method comprising:
    forming a protection layer on a semiconductor substrate having a cell array region and an alignment key region;
    forming a plurality of data storage elements on the protection layer in the cell array region;
    forming an insulating layer on the data storage elements;
    forming a barrier layer on the insulating layer;
    forming a sacrificial layer on the barrier layer;
    patterning the sacrificial layer, the barrier layer and the insulating layer to form contact holes that expose the data storage elements;
    forming conductive plugs in the contact holes;
    etching the sacrificial layer to leave portions of the conductive plugs protruding from the barrier layer; and
    polishing to remove the protruding portions of the conductive plugs.

2. The method of claim 1:
    wherein forming a plurality of data storage elements comprises:
        forming a plurality of phase change material regions on the protection layer; and
        forming respective upper electrodes on respective ones of the phase change material regions; and
    wherein patterning the sacrificial layer, the barrier layer and the insulating layer to form contact holes that expose the data storage elements comprises patterning the sacrificial layer, the barrier layer and the insulating layer to form contact holes that expose the upper electrodes.

3. The method of claim 2, wherein forming a plurality of data storage elements further comprises forming a plurality of lower electrodes in the protection layer, and wherein forming a plurality of phase change material regions comprises forming respective ones of the phase change material regions on respective ones of the lower electrodes.

4. The method of claim 3, wherein the contact holes are wider than the lower electrodes.

5. The method of claim 1, wherein the barrier layer comprises an impurity blocking layer and/or a stress buffer layer.

6. The method of claim 1, wherein the barrier layer comprises a silicon nitride layer and/or a silicon oxynitride layer, and wherein the sacrificial layer comprises a silicon oxide layer.

7. The method of claim 1, wherein the barrier layer comprises a silicon nitride layer, an aluminum oxide layer and/or a titanium oxide layer.

8. The method of claim 1, wherein the barrier layer provides a stress opposite to a stress provided by the insulating layer and the sacrificial layer.

9. The method of claim 1, wherein the barrier layer provides a compressive stress and wherein the insulating layer and the sacrificial layer glass (USG) layer provide a tensile stress.

10. The method of claim 1, wherein the conductive plugs comprise tungsten, titanium nitride, titanium aluminum nitride (TiAlN), tantalum nitride and/or a titanium tungsten (TiW).

11. The method of claim 1, wherein forming conductive plugs in the contact holes comprises:
    forming a conductive layer on the sacrificial layer and filling the contact holes; and
    etching the conductive layer to form the conductive plugs.

12. The method of claim 11, wherein etching the conductive layer comprises dry and/or wet etching.

13. The method of claim 1, wherein patterning the sacrificial layer, the barrier layer and the insulating layer to form contact holes that expose the data storage elements comprises patterning the sacrificial layer, the barrier layer and the insulating layer to form the contact holes in the cell array region and a trench in the alignment key region, and wherein the method further comprises forming an alignment key in the alignment key trench.

14. The method of claim 13, wherein the alignment key trench is deeper than the contact holes.

15. The method of claim 13, wherein forming conductive plugs in the contact holes and forming an alignment key comprise:
    forming a conductive layer on the sacrificial layer, filling the contact holes and conforming to the alignment key trench;
    etching the conductive layer to form the conductive plugs and a conductive region disposed in the alignment key trench and on the sacrificial layer adjacent to the alignment key trench; and
    wherein polishing to remove the protruding portions of the conductive plugs comprises polishing to remove the protruding portions of the conductive plugs and to remove a portion of the conductive region on the sacrificial layer adjacent the alignment key trench and thereby form the alignment key in the alignment key trench.

16. The method of claim 13, further comprising:
    forming a conductive plate layer on the contact plugs; and
    patterning the conductive plate layer using the alignment key to form plate lines on the contact plugs.

17. The method of claim 1, wherein etching the sacrificial layer to leave portions of the conductive plugs protruding from the barrier layer comprises etching the sacrificial layer without polishing to leave portions of the conductive plugs protruding from the barrier layer.

* * * * *